United States Patent
Wu

Patent Number: 5,985,737
Date of Patent: Nov. 16, 1999

[54] METHOD FOR FORMING AN ISOLATION REGION IN AN INTEGRATED CIRCUIT

[75] Inventor: Shye-Lin Wu, Hsinchu, Taiwan

[73] Assignee: Texas Instruments - Acer Incorporated, Hsinchu, Taiwan

[21] Appl. No.: 09/034,635

[22] Filed: Mar. 4, 1998

[51] Int. Cl.[6] .................................................. H01L 21/762
[52] U.S. Cl. .......................................................... 438/448
[58] Field of Search ..................................... 438/445, 446, 438/448, FOR 229, FOR 230; 148/DIG. 117, DIG. 85, DIG. 86

[56] References Cited

U.S. PATENT DOCUMENTS

| | | |
|---|---|---|
| 4,563,227 | 1/1986 | Sakai et al. . |
| 4,927,780 | 5/1990 | Roth et al. . |
| 5,175,123 | 12/1992 | Vasquez et al. . |
| 5,326,715 | 7/1994 | Jang et al. . |
| 5,393,692 | 2/1995 | Wu . |

FOREIGN PATENT DOCUMENTS

| | | |
|---|---|---|
| 1-30245 | 2/1989 | Japan . |
| 2-68929 | 3/1990 | Japan . |

OTHER PUBLICATIONS

Cooper, K.J., et al., "Recessed Polysilicon Encapsulated Local Oxidation", IEEE Electron Device Letters, vol. 12, No. 10, pp. 515–517, Oct. 1991.
Andres Bryant et al., Characteristics of CMOS Device Isolation for the ULSI Age, 1994 IEEE, pp. 671–674.
J.R. Pfiester et al., *Nitride–Clad LOCOS Isolation for 0.25 µm CMOS*, Advanced Products Research and Development Laboratory, Motorola, Inc., (date unknown), pp. 139 and 140.
J. Nagel et al., *Stress–Induced Void Formation in Interlevel Polysilicon Films during Polybuffered Local Oxidation of Silicon*, J. Electrochem. Soc., vol. 140, No. 8, Aug. 1993, pp. 2356–2359.
Toshio Kobayashi et al., Nitrogen In–Situ Doped Poly Buffer LOCOS: Simple and Scalable Isolation Technology for Deep–Submicron Silicon Devices, IEEE Transactions on Electron Devices, vol. 43, No. 2, Feb. 1996, pp. 311–316.

*Primary Examiner*—George R. Fourson
*Attorney, Agent, or Firm*—Harness, Dickey & Pierce, P.L.C.

[57] ABSTRACT

A method for forming an isolation region in an integrated circuit is disclosed. The method includes forming a pad layer (12) on a semiconductor substrate (10), and forming an oxidation masking layer (14) on the pad layer, wherein the pad layer relives stress from the oxidation masking layer. Next, the oxidation masking layer and the pad layer are patterned and etched to expose a portion of the substrate. After laterally removing the pad layer to form at least one undercut under the oxidation masking layer, a doped layer (16) is conformably formed on the oxidation masking layer, the pad layer, and the substrate, thereby refilling the undercut with the doped layer. Finally, the doped layer is anisotropically etched to form spacers (16A) on sidewalls of the oxidation masking layer and the pad layer, and the substrate is then thermally oxidized to form the isolation region (18) in the substrate, wherein doping atoms in the doped layer will diffuse into the substrate.

19 Claims, 5 Drawing Sheets

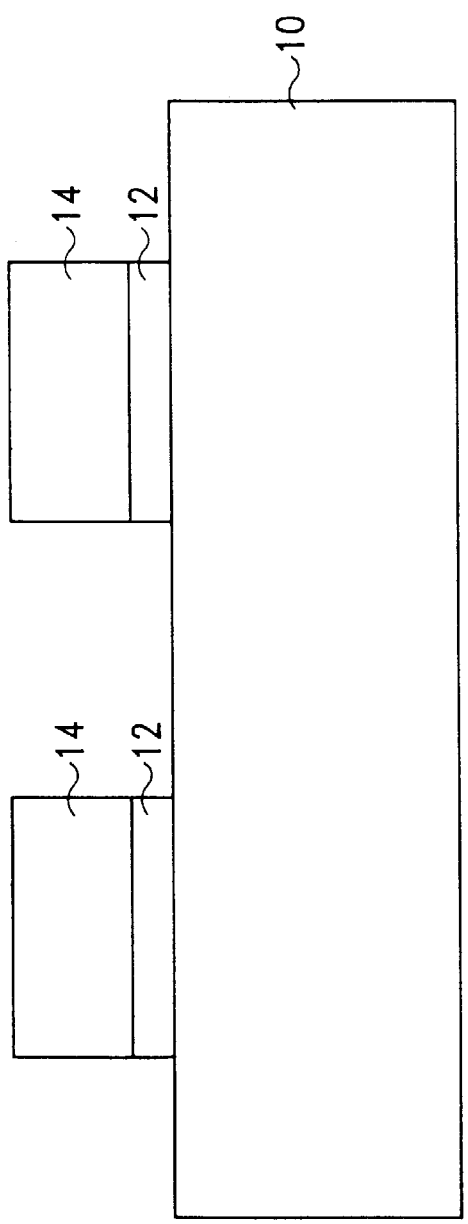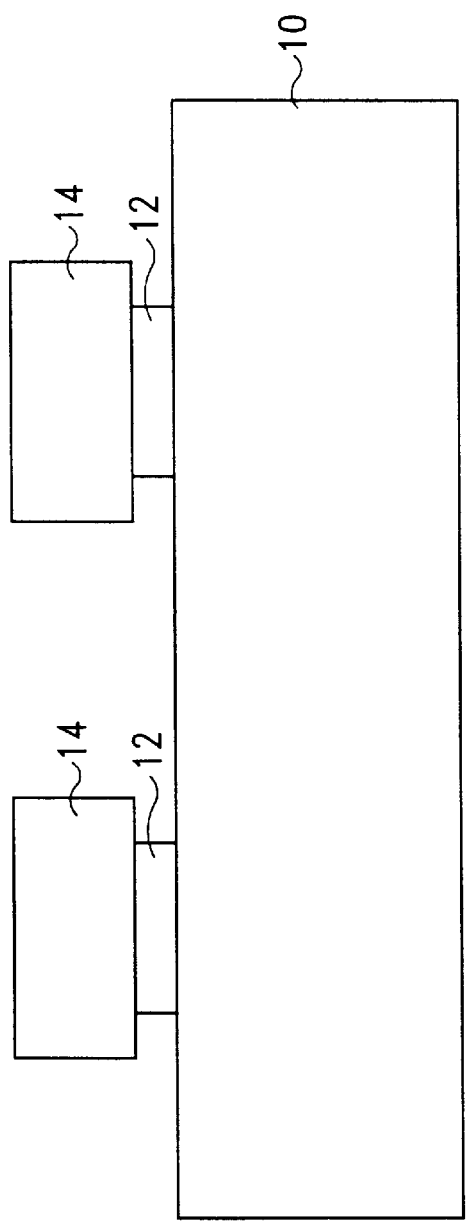

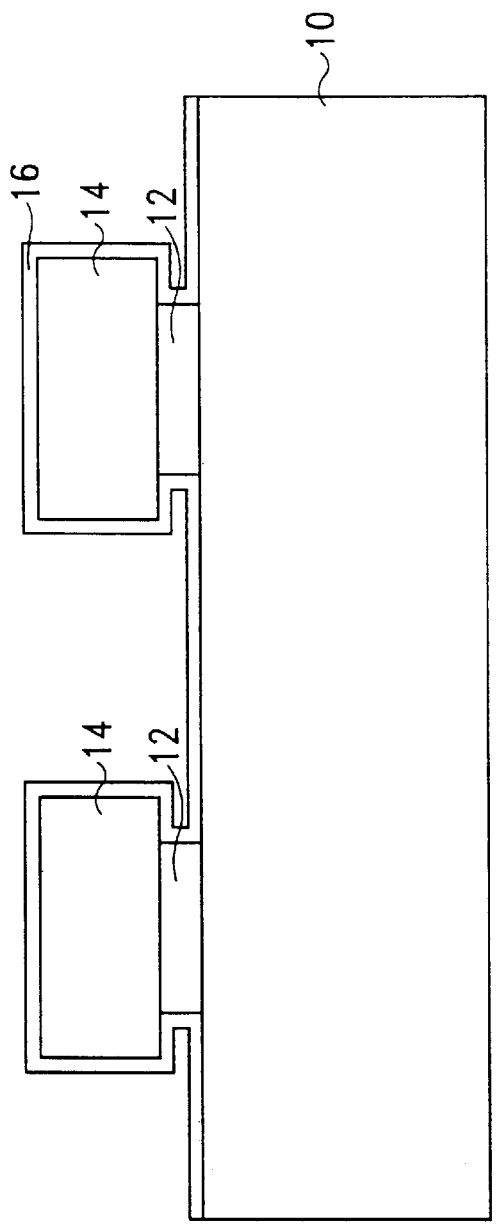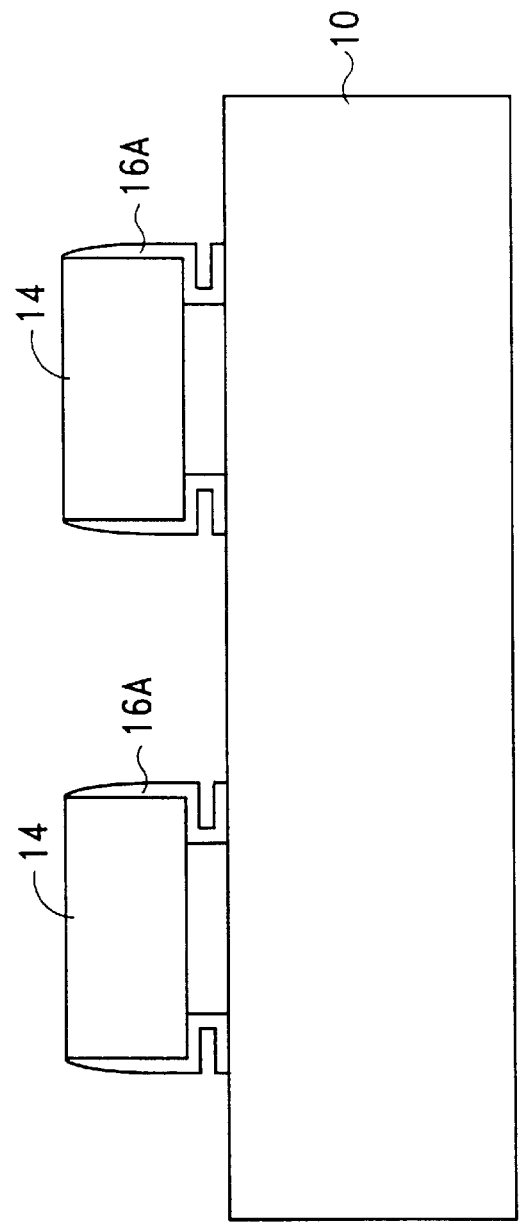

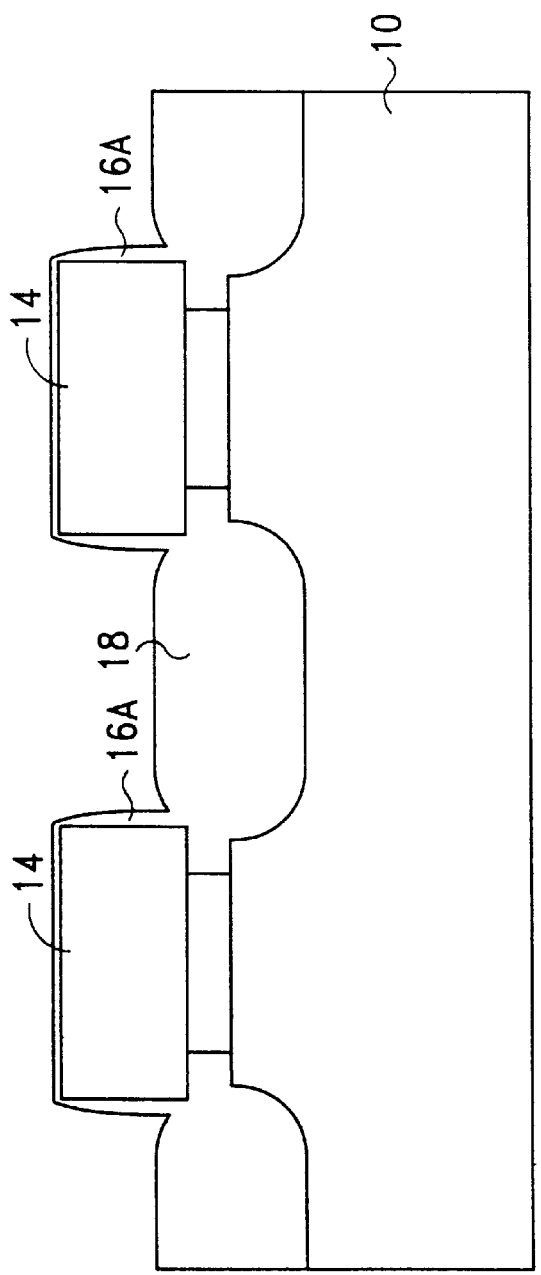
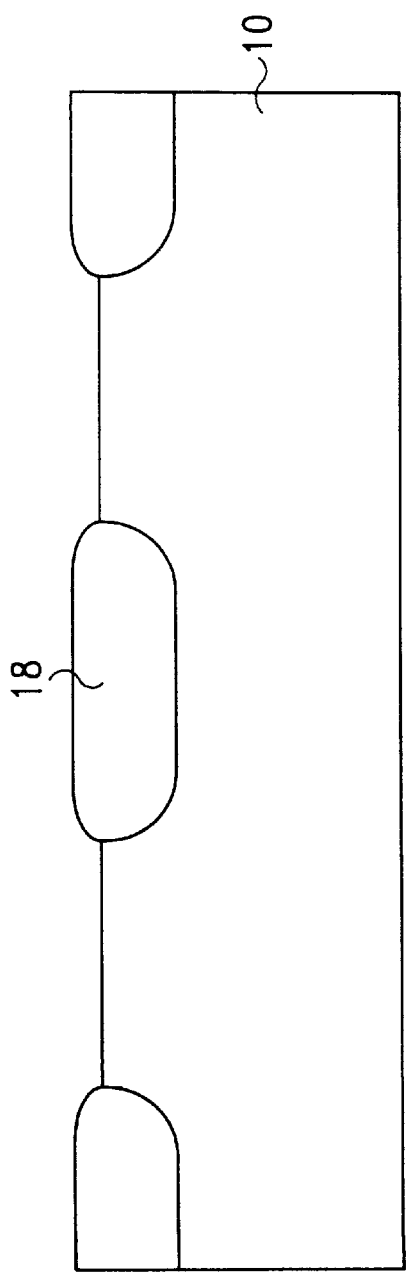

METHOD FOR FORMING AN ISOLATION REGION IN AN INTEGRATED CIRCUIT

BACKGROUND OF THE INVENTION

1. Field of the Invention

The present invention relates to a method for forming isolation regions, and more particularly, to an improved local oxidation of silicon (LOCOS) method.

2. Description of the Prior Art

The art of isolating semiconductor devices becomes one important aspect of modem metal-oxide-semiconductor (MOS) and bipolar integrated circuit technology. With increasing densities of up to hundreds of thousands of devices on a single chip, improper isolation among devices will cause current leakages. These current leakages can consume significant amounts of power. In addition, improper isolation between devices can exacerbate latchup, which can damage the circuit temporarily or permanently. Still further, improper isolation can result in noise margin degradation, voltage shift or crosstalk.

In MOS technology, isolation is usually practiced by forming isolation regions between neighboring active regions. Typically, an isolation region is formed by ion-implanting a channel stop layer of polarity opposite to the source electrode and the drain electrode of the integrated circuit device, and growing a thick oxide, often referred to as field oxide (FOX). The channel stop and the FOX cause the threshold voltage in the isolation region to be much higher than those of the neighboring active devices, making surface inversion not likely to occur under the field oxide region.

The local oxidation of silicon (LOCOS) method is widely used to isolate active regions in silicon. In LOCOS technology, a silicon nitride layer is used as an efficient oxidation mask which prevents the oxidants from reaching the silicon surface covered by silicon nitride. In addition, the silicon nitride layer oxidizes very slowly compared to silicon. However, direct deposition of silicon nitride on silicon can cause stress induced defects when the structure is subjected to oxidation at elevated temperature. These defects can be considerably reduced by forming a thin (100–500 angstroms) pad oxide layer between the silicon and the silicon nitride. The pad oxide reduces the force transmitted to the silicon by relieving the stress. It thus acts as a buffer which cushions the transmission of stress between the silicon and the silicon nitride.

Unfortunately, the pad oxide layer provides a lateral path for oxidation of silicon. This lateral extension of oxidation through pad oxide is frequently referred to as a "bird's beak" because of its form. The extent of the bird's beak can be reduced by decreasing the thickness of the pad oxide, which, however will cause more stress induced defects from the above silicon nitride layer. Therefore, the thickness of the pad oxide and the silicon nitride layer must be optimized to minimize the extent of the bird's beak without generating defects.

Beside bird's beak effect, another important limitation is tide sharp decrease in the field oxide thickness as the isolation spacing is reduced below 1 micrometer. The narrower the opening is, the thinner the field oxide will be. This effect is frequently called field oxide thinning effect, and is more serious for deep sub-micron semiconductor devices. The aforementioned bird's beak effect, the local field oxide thinning effect, and the stress-induced silicon defect are discussed in some references, such as that disclosed by Andres Bryant et al., "Characteristics of CMOS Device Isolation for the ULSI Age," IEDN Tech. Dig., 1994, pages 671–674 which is hereby incorporated by reference.

Several methods in the prior art have been designed for improving the LOCOS isolation process to minimize the bird's beak. For example, a nitride-clad LOCOS (NCL) isolation is disclosed, for example, by J. R. Pfiester et al., "Nitride-Clad LOCOS Isolation for 0.25 $\mu$m CMOS," VLSI Tech. Symp. Dig., 1993, pages 139–140 which is hereby incorporated by reference. Unfortunately, the NCL process usually causes some defects at the edge of the isolation region. Another isolation method, called polysilicon buffer LOCOS (PBL) isolation, is also used to overcome the disadvantages of the conventional LOCOS method. See reference disclosed by J. Nagel et al., "Stress-induced Void Formation in Interlevel Polysilicon Films during Poly-buffered Local Oxidation of Silicon," J. Electrochem. Soc., vol. 140, 1993, pages 2356–2359 which is hereby incorporated by reference. One of the disadvantages induced from the PBL method is the formation of voids or pits.

Other isolation methods are also available. For example, the sealed-interface local oxidation (SILO) process uses an additional thin silicon nitride over the silicon substrate followed by forming a pad oxide layer and then a thick silicon nitride layer. The SILO process can reduce the bird's beak, but at the expense of generating more stress, more crystal defects, and higher leakage currents.

Another improved LOCOS method, called buried oxide (BOX) process, has been devised which uses an aluminum mask to etch a silicon groove and then subsequently remove a plasma deposited silicon dioxide layer. The BOX process can effectively reduce the bird's beak, but at the expense of manufacture complexity.

SUMMARY OF THE INVENTION

In accordance with the present invention, a method is provided for forming an isolation region in an integrated circuit that substantially improves the bird's beak effect, the local field oxide thinning effect, and the stress-induced silicon defect. In one embodiment, a pad oxide layer is formed on a semiconductor substrate, and a silicon nitride layer is formed on the pad oxide layer. Next, the silicon nitride layer and the pad oxide layer are patterned and etched to expose a portion of the substrate. After laterally removing the pad oxide layer to form at least one undercut under the silicon nitride layer, a nitrogen-doped layer is conformably formed on the silicon nitride layer, the pad oxide layer, and the substrate, thereby refilling the undercut with the anti-oxidation layer, wherein the nitrogen-doped layer has greater oxidation resistance than the pad oxide layer. Finally, the nitrogen-coped layer is anisotropically etched to form spacers on sidewalls of the silicon nitride layer, and the substrate is thermally oxidized to form the isolation region in the substrate, wherein nitrogen atoms in the nitrogen-doped layer diffuse into the substrate.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 2 shows the structure after anisotropically etching the silicon nitride layer and the pad oxide;

FIG. 3 shows the resulting structure after laterally undercutting the pad oxide layer;

FIG. 4 illustrates forming a nitrogen-doped layer on the silicon nitride layer and the substrate;

FIG. 5 shows a cross section of the spacers;

FIG. 6 shows a cross section of a thermally grown field oxide according to the embodiment of the present invention;

FIG. 7 shows the structure after removing the nitrogen-doped layer, the silicon nitride layer, and the pad oxide layer;

DESCRIPTION OF THE PREFERRED EMBODIMENT

Figure 1:
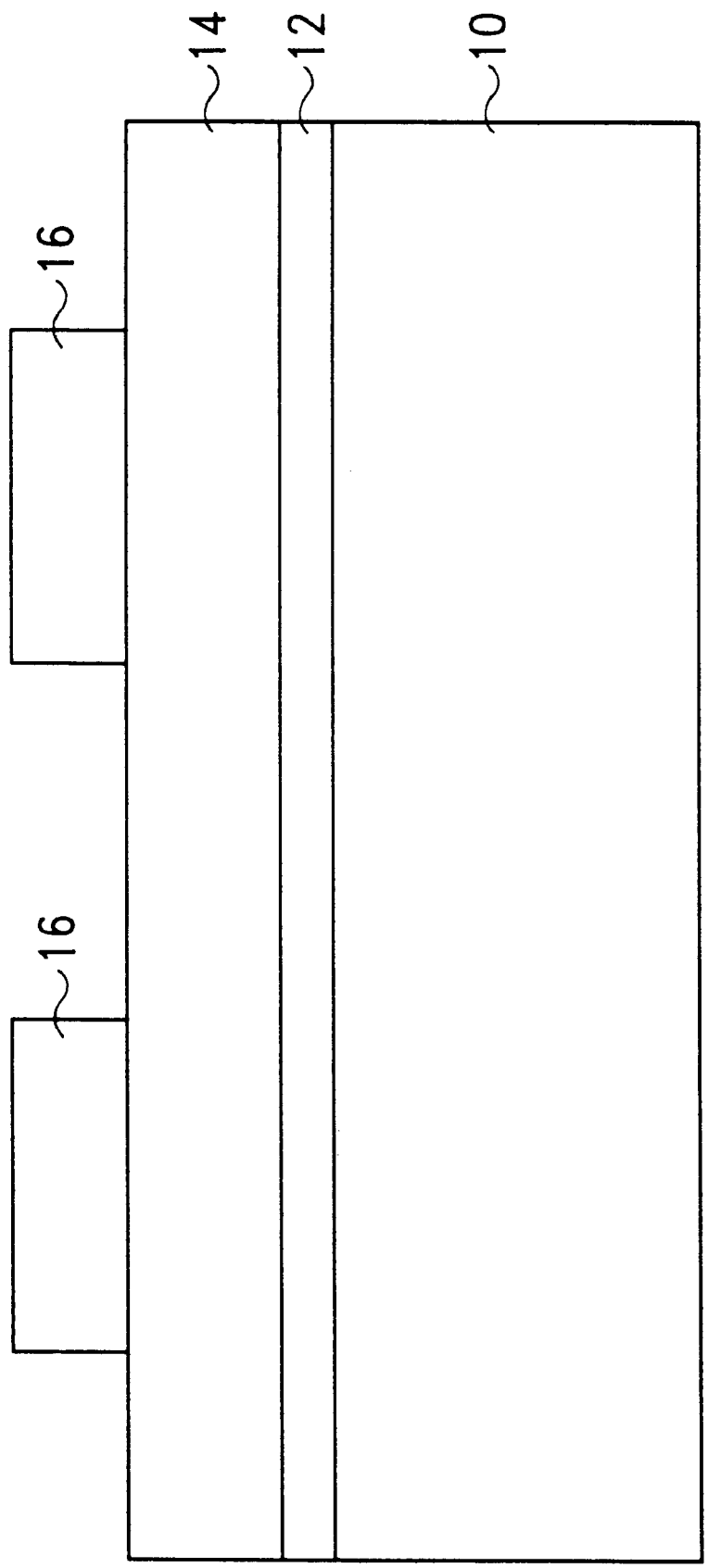
FIG. 1 shows a schematic cross-section of a semiconductor substrate, whereon a pad oxide layer and a silicon nitride layer are formed according to one embodiment of the present invention.

FIG. 1 shows a schematic cross-section of a semiconductor substrate 10. A silicon oxide layer 12 is grown, for example, at about 1000° C. in a conventional furnace. In this embodiment, the thickness of the silicon oxide layer 12 is preferably in the range of about 50–350 angstroms. Then, a silicon nitride layer 14 is deposited, for example, using a low pressure chemical vapor deposition (LPCVD) process. The silicon nitride layer 14 has a thickness of about 1000–3000 angstroms. The silicon oxide layer 12 is frequently referred to as a pad oxide in isolation techmology and is used to reduce the force transmitted from the silicon nitride layer 14 to the substrate 10. The silicon nitride layer 14 is, however, used as an oxidation mask which prevents the oxidants from reaching the substrate 10 under the silicon nitride layer 14 in a later oxidation step. Thereafter, a photoresist masking layer 16 having an active region (or active area) pattern is formed over the silicon nitride layer 14. This pattern is defined using standard photoresist coating, exposure and development processes.

Next, the silicon nitride layer 14 and the pad oxide layer 12 are etched using the photoresist layer 16 as a mask. FIG. 2 shows the structure after anisotropically etching the silicon nitride layer 14 and the pad oxide 12.

Referring to FIG. 3, a portion of the pad oxide layer 12 is, isotropically etched to form a lateral undercut under the silicon nitride layer 14. The lateral width of the undercut is preferably between 100 and 1000 angstroms. Typically, a wet etchant such as diluted hydrofluoric (HF) solution is used because it has the advantage of dissolving silicon dioxide without attacking silicon and silicon nitride. Practically, the HF is mixed with ammonium fluoride ($NH_4F$), known as a buffered oxide etch (BOE), to slow down the etch rate into a more controllable process. This etch step is primarily utilized to reduce bird's beak during later oxidation process.

Next, a nitrogen-doped anti-oxidation layer 16, such as nitrogen-doped polysilicon or nitrogen-doped amorphous-silicon, is conformably deposited on the silicon nitride layer 14, the silicon oxide layer 12, and the substrate 10 as shown in FIG. 4. The nitrogen-doped amorphous-silicon layer 16 can prevent void or pit formation, and also can reduce leakage. Further, the undercut adjacent to the remaining pad oxide layer 12 is also refilled with the nitrogen-doped layer 16, so that the remaining pad oxide 12 is encapsulated by the nitrogen-doped layer 16. In this embodiment, this nitrogen-doped layer 16 is preferably deposited using a conventional low pressure chemical vapor deposition (LPCVD) process to a thickness of about 50–500 angstroms. It is noted that the nitrogen-doped layer 16 has greater oxidation hardness (or resistance) than the pure oxide of the pad oxide layer 12. The control of the oxidation resistance in the nitrogen-doped layer 16 is preferably achieved by adjusting the dosage of nitrogen atoms in the nitrogen-doped layer 16. Furthermore, the mechanical stress from the nitrogen-doped layer 16 to the substrate is less than that of silicon nitride in the conventional nitride-clad LOCOS method. It is appreciated that the doping material other than the nitrogen in the anti-oxidation layer 16 can also be used without departing from the scope of the claimed invention, provided that the resultant doped anti-oxidation has greater oxidation hardness than the pure oxide, or/and has mechanical stress less than that of silicon nitride.

Thereafter, the nitrogen doped layer 16 is anisotropically etched, for example, by a plasma etch process such as reactive ion etch (RIE), therefore forming nitrogen-doped spacers 16A on the sidewalls of the silicon nitride layer 14 as shown in FIG. 5.

The structure of FIG. 5 is then subjected to thermal oxidation or steam oxidation to thermally grow a thick field oxide 18 on and in the substrate 10, and between the spacers 16A as shown in FIG. 6. In this embodiment, the thickness of this field oxide 18 is about 3000–10000 angstroms, and the temperature of oxidation is about 950–1150° C. It is noted that the oxidation rate of the nitrogen-doped polysilicon or amorphous-silicon is much lower than that of an undoped-polysilicon. Furthermore, during the oxidation stage, the nitrogen atoms in the anti-oxidation layer 16 will diffuse into the substrate 10 near the field oxide region 18, improving the bird's beak effect and the oxidation-induced stress. It is noted that the nitrogen-doped spacers 16A on the sidewalls of the silicon nitride layer 14 can further reduce bird's beak.

Figure 8:
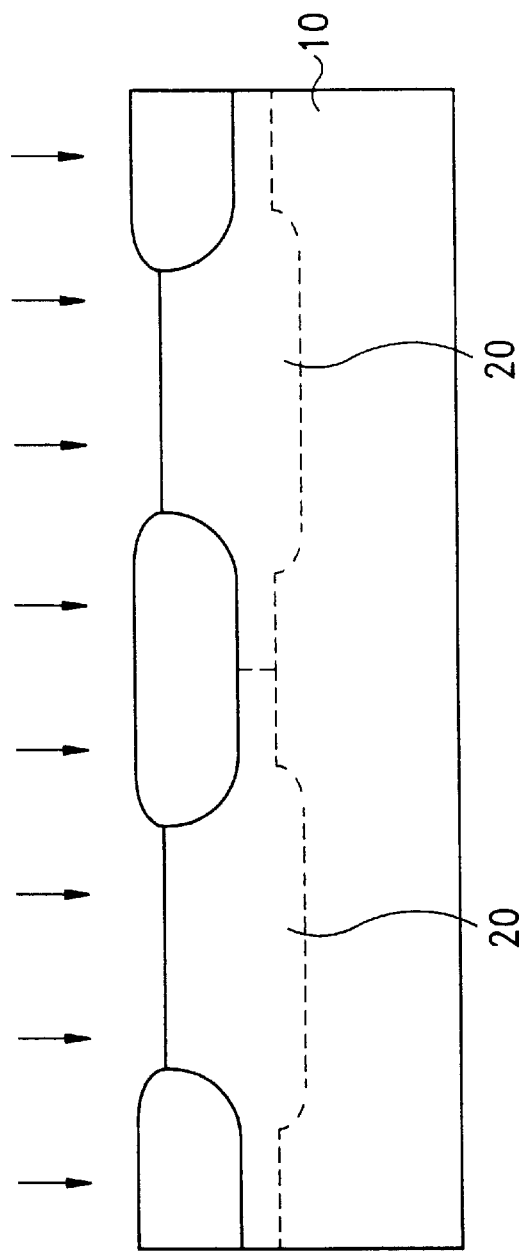
FIG. 8 shows a cross section of a retrograde twin well.
Figure 9:
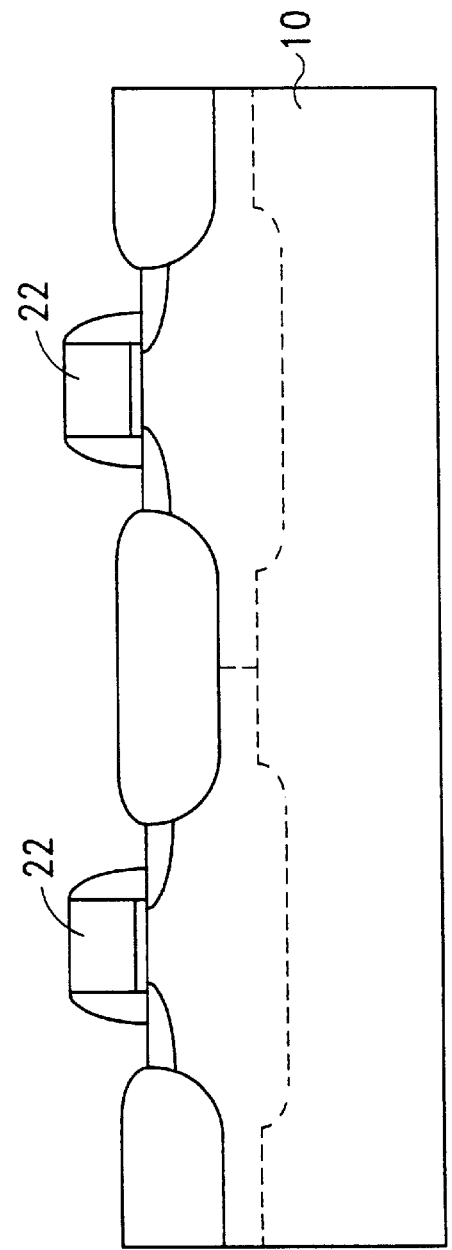
FIG. 9 shows a resultant structure wherein metal-oxide-semiconductor field effect transistors (MOSFETs) are formed.

After forming the field oxide region 18, the nitrogen-doped layer 16, the silicon nitride layer 14, and the pad oxide layer 12 are removed using a suitable etch method, resulting in a cross section as shown in FIG. 7. Afterwards, a high energy (about 1–3 MeV, and $10_{12}$–$10_{14}$ ions/cm$^2$) implantation is performed to form retrograde twin well 20 as shown in FIG. 8. Finally, semiconductor devices, such as metal-oxide-semiconductor field effect transistors (MOSFETs) 22 are fabricated in standard process, resulting in the structure of FIG. 9.

Although specific embodiments have been illustrated and described, it will be obvious to those skilled in the art that various modifications may be made without departing from the spirit which is intended to be limited solely by the appended claims.

What is claimed is:

1. A method for forming an isolation region, said method comprising:

forming a pad layer on a semiconductor substrate;

forming an oxidation masking layer on said pad layer, said pad layer relieving stress from said oxidation masking layer;

patterning to etch said oxidation masking layer and said pad layer, therefore exposing a portion of the substrate;

laterally removing said pad layer to form at least one undercut under said oxidation masking layer;

conformably forming a doped layer on said oxidation masking layer, said pad layer, and the substrate, thereby refilling said at least one undercut with said doped layer;

anisotropically etching said doped layer to form spacers on sidewalls of said oxidation masking layer and said pad layer; and thermally oxidizing the substrate to form the isolation region in the substrate, wherein a plurality of doping atoms in said doped layer diffuse into said substrate.

2. The method according to claim 1, wherein said doped layer has greater oxidation resistance than said pad layer.

3. The method according to claim 1, wherein said doped layer generates less stress than said oxidation masking layer.

4. The method according to claim 1, wherein said pad layer comprises silicon oxide.

5. The method according to claim 1, wherein said oxidation masking layer comprises silicon nitride.

6. The method according to claim 1, wherein said doped layer comprises nitrogen-doped polysilicon.

7. The method according to claim 1, wherein said doped layer comprises nitrogen-doped amorphous-silicon.

8. A method for forming an isolation region, said method comprising:

forming a pad layer on a semiconductor substrate;

forming an oxidation masking layer on said pad layer, said pad layer relieving stress from said oxidation masking layer;

patterning to etch said oxidation masking layer and said pad layer, therefore exposing a portion of the substrate;

laterally removing said pad layer to form at least one undercut under said oxidation masking layer;

encapsulating said at least one undercut with doped layer; and thermally oxidizing the substrate to form the isolation region in the substrate, wherein a plurality of doping atoms in said doped layer diffuse into said substrate.

9. The method according to claim 8, wherein said doped layer has greater oxidation resistance than said pad layer.

10. The method according to claim 8, wherein said doped layer generates less stress than said oxidation masking layer.

11. The method according to claim 8, wherein said pad layer comprises silicon oxide.

12. The method according to claim 8, wherein said oxidation masking layer comprises silicon nitride.

13. The method according to claim 8, wherein said doped layer comprises nitrogen-doped polysilicon.

14. The method according to claim 8, wherein said doped layer comprises nitrogen-doped amorphous-silicon.

15. A method for forming an isolation region, said method comprising:

forming a pad oxide layer on a semiconductor substrate;

forming a silicon nitride layer on said pad oxide layer;

patterning to etch said silicon nitride layer and said pad oxide layer, therefore exposing a portion of the substrate;

laterally removing said pad oxide layer to form at least one undercut under said silicon nitride layer;

conformably forming a nitrogen-doped layer on said silicon nitride layer, said pad oxide layer, and the substrate, thereby refilling said at least one undercut with said nitrogen-doped layer, said nitrogen-doped layer having greater oxidation resistance than said pad oxide layer;

anisotropically etching said nitrogen-doped layer to form spacers on sidewalls of said silicon nitride layer; and thermally oxidizing the substrate to form the isolation region in the substrate, wherein a plurality of nitrogen atoms in the nitrogen-doped layer diffuse into said substrate.

16. The method according to claim 15, wherein said nitrogen-doped layer is formed using a low pressure chemical vapor deposition process.

17. The method according to claim 15, wherein the oxidation resistance of said nitrogen-doped layer is controlled by adjusting the value of a dosage of nitrogen.

18. The method according to claim 15, wherein the nitrogen-doped layer comprises polysilicon.

19. The method according to claim 15, wherein the nitrogen-doped layer comprises amorphous-silicon.

* * * * *